United States Patent
Izutsu et al.

(10) Patent No.: US 6,704,238 B2
(45) Date of Patent: Mar. 9, 2004

(54) SEMICONDUCTOR MEMORY DEVICE INCLUDING DATA BUS PAIRS RESPECTIVELY DEDICATED TO DATA WRITING AND DATA READING

(75) Inventors: Takashi Izutsu, Hyogo (JP); Shigeki Ohbayashi, Hyogo (JP); Yoji Kashihara, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 6 days.

(21) Appl. No.: 10/223,292

(22) Filed: Aug. 20, 2002

(65) Prior Publication Data

US 2003/0156487 A1 Aug. 21, 2003

(30) Foreign Application Priority Data

Feb. 21, 2002 (JP) ......................................... 2002-044527

(51) Int. Cl.[7] ................................................. G11C 8/00
(52) U.S. Cl. .................................... 365/230.03; 365/201
(58) Field of Search ............................ 365/230.03, 201, 365/203

(56) References Cited

U.S. PATENT DOCUMENTS 6,434,661 B1 * 8/2002 Konishi et al. ............... 711/105
6,587,385 B2 * 7/2003 Ooishi ........................ 365/191

* cited by examiner

*Primary Examiner*—Michael Tran
(74) *Attorney, Agent, or Firm*—McDermott, Will & Emery

(57) ABSTRACT

During a burn-in test, each read selection gate, each write selection gate, a write control circuit, and a sense amplifier circuit are activated, and a read data bus precharge and equalize circuit and a global read data bus precharge and equalize circuit are inactivated. As a result, a voltage difference applied between a global write data bus pair is transferred to each of a write data bus pair, a bit line pair, a read data bus pair, and a global read data bus pair without involving a mode switching.

7 Claims, 6 Drawing Sheets

SEMICONDUCTOR MEMORY DEVICE INCLUDING DATA BUS PAIRS RESPECTIVELY DEDICATED TO DATA WRITING AND DATA READING

BACKGROUND OF THE INVENTION

1. Field of the Invention

The present invention relates to a semiconductor memory device and, more particularly, to a defect acceleration test by applying a voltage stress (also referred to as "a burn-in test" hereinafter) in a semiconductor memory device including data bus pairs respectively dedicated to data writing and data reading.

2. Description of the Background Art

To speed up data reading and writing operations, it is known to arrange data bus pairs formed with complementary data buses independently for data writing and data reading, respectively.

FIG. 5 is a circuit diagram showing a structure of conventional semiconductor memory device independently including a read data bus pair for data reading and a write data bus pair for data writing.

Referring to FIG. 5, conventional semiconductor memory device 2 includes at least one memory block MB having a plurality of memory cells MCs arranged in rows and columns. In each memory block MB, a plurality of word lines WLs are arranged corresponding to respective memory cell rows, and a plurality of bit line pairs BLPs are arranged corresponding to respective memory cell columns. Each bit line pair BLP has complementary bit lines BIT and /BIT. A structure of kth (k is a natural number) memory block MBk is representatively shown in FIG. 5. In the memory block MBk, word lines WLk1–WLkm are arranged corresponding to respective m (m is a natural number) memory cell rows, and bit line pairs BLPk1–BLPkn are arranged corresponding to respective n (n is a natural number) memory cell columns. A bit line pair BLPk1 is, for example, formed with complementary bit lines BITk1 and /BITk1, and a bit line pair BLPkn is formed with complementary bit lines BITkn and /BITkn.

Semiconductor memory device 2 further includes a write data bus pair LWDBP and a read data bus pair LRDBP provided corresponding to each memory block MB, and a global write data bus pair GWDBP and a global read data bus pair GRDBP provided to a plurality of memory blocks MBs in common. A write data bus pair LWDBPk and a read data bus pair LRDBPk used to data reading and data writing for the memory block MBk are representatively shown in FIG. 5. The write data bus pair LWDBPk is formed with complementary write data buses LWDBk and /LWDBk, and the read data bus pair LRDBPk is formed with complementary read data buses LRDBk and /LRDBk. Similarly, the global write data bus pair GWDBP is formed with complementary global write data buses GWDB and /GWDB, and the global read data bus pair GRDBP is formed with complementary read data buses GRDB and /GRDB.

Semiconductor memory device 2 further includes a plurality of bit line precharge and equalize circuits 10, a plurality of read selection gates 20, a plurality of write selection gates 30, a write control circuit 40, a sense amplifier circuit 50, a read data bus drive circuit 60, a read data bus precharge and equalize circuit 70, a global read data bus precharge and equalize circuit 80, and control circuits 500, 510.

Bit line precharge and equalize circuit 10 is provided corresponding to each memory cell column, and is activated in response to a block activation signal BACTk. More specifically, each bit line precharge and equalize circuit 10 isolates each of the complementary bit lines BIT and /BIT forming the corresponding bit line pair BLP from a bit line precharge voltage Vbp when the corresponding memory block MBk is selected to activate the block activation signal BACTk (to the H level) and a corresponding column selection signal Y1 is also activated (to the H level). In the other periods, it electrically couples each of the corresponding bit lines BITk1 and /BITk1 to the bit line precharge voltage Vbp for precharging.

Read selection gate 20 is provided corresponding to each memory cell column, and is activated in response to a block read activation signal RBACTk. When activated, read selection gate 20 connects the bit line pair BLP of the corresponding memory cell column to the read data bus pair LRDBPk in response to the corresponding one of the column selection signals Y1–Yn. When inactivated, each read selection gate 20 disconnects the bit line pair BLP of the corresponding memory cell column from the read data bus pair LRDBPk, regardless of the corresponding column selection signal.

Write selection gate 30 is provided corresponding to each memory cell column, and is activated in response to a block write activation signal WBACTk. When activated, write selection gate 30 connects the bit line pair BLP of the corresponding memory cell column to the write data bus pair LWDBPk in response to the corresponding one of the column selection signals Y1–Yn. When inactivated, each write selection gate 30 disconnects the bit line pair BLP of the corresponding memory cell column from the write data bus pair LWDBPk, regardless of the corresponding column selection signal.

Write control circuit 40 is activated in response to the block write activation signal WBACTk. When activated, it sets the voltages of the write data buses LWDB and /LWDB corresponding to the voltages of the global write data buses GWDB and /GWDB which transfer the write data.

Sense amplifier circuit 50 is activated in response to a block sense enable signal BSSEk. When activated, it amplifies a voltage difference between the read data buses LRDBk and /LRDBk.

Read data bus drive circuit 60 drives the voltages of the global read data buses GRDB and /GRDB such that, the voltage difference corresponding to that between the read data buses LRDBk and /LRDBk is generated between the global read data buses GRDB and /GRDB.

Read data bus precharge and equalize circuit 70 is provided corresponding to the read data bus pair LRDBPk, and is activated in response to a local precharge signal /LDPCHk. When activated, read data bus precharge and equalize circuit 70 sets each of the corresponding read data buses LRDBk and /LRDBk to the precharge voltage (for example, a power supply voltage Vcc). When inactivated, it isolates each of the corresponding read data buses LRDBk and /LRDBk from the precharge voltage.

Though bit line precharge and equalize circuit 10, the plurality of read selection gates 20, the plurality of write selection gates 30, write control circuit 40, sense amplifier circuit 50, read data bus drive circuit 60, and read data bus precharge and equalize circuit 70 corresponding to the memory block MBk are representatively shown in FIG. 5, such circuit group is similarly provided to each memory block.

Global read data bus precharge and equalize circuit 80 is activated in response to a global precharge signal /GDPCH. When activated, it sets each of the global read data buses GRDB and /GRDB to the precharge voltage (for example, the power supply voltage Vcc). When inactivated, it isolates each of the global read data buses GRDB and /GRDB from the precharge voltage.

The structure of the control circuit will be described in the following. Hereinafter, a high voltage state (the high level) and a low voltage state (the low level) of each signal line, signal or data having binary levels will simply be referred to as "the H level" and "the L level".

Control circuit 500 generates a read activation signal RACT and a sense enable signal SE which are activated in data reading. Control circuit 500 includes an internal clock signal intCLK, a logic gate 502 outputting an NAND logical operation result with a read cycle signal RE which is set to the H level in data reading, an inverter 504 inverting the output of logic gate 502, and a delay circuit 506 delaying the output of inverter 504. The output of inverter 504 is provided as the read activation signal RACT to control circuit 510. The output of delay circuit 506 is provided as the sense enable signal SE to control circuit 510.

Control circuit 510 controls the activation of bit line precharge and equalize circuit 10, read selection gate 20, write selection gate 30, write control circuit 40, sense amplifier circuit 50, read data bus precharge and equalize circuit 70, and global read data bus precharge and equalize circuit 80. In FIG. 5, a structure to control the activation of such circuit group corresponding to the memory block MBk is representatively shown for control circuit 510.

Control circuit 510 includes a logic gate 512 outputting an NAND logical operation result of a block selection signal Zk which is activated to the H level when the memory block MBk is selected and a chip activation signal ACT, and an inverter 514 inverting the output of logic gate 512 and generating the block activation signal BACTk. Control circuit 510 further includes a logic gate 522 outputting an NAND logical operation result of a write activation signal WACT and the block selection signal Zk, and an inverter 524 inverting the output of logic gate 522 and outputting the block write activation signal WBACTk.

The block activation signal BACTk is activated in a synchronized timing with the chip activation signal ACT when the corresponding memory block MBk is selected in each of data writing (the write mode) and data reading (the read mode). The block write activation signal WBACTk is activated in a synchronized timing with the write activation signal WACT when the corresponding memory block MBk is selected in data writing (the write mode).

The block activation signal BACTk is also used as the activation signal of the plurality of bit line precharge and equalize circuits 10 provided corresponding to the memory block MBk. More specifically, bit line precharge and equalize circuit 10 is activated when the corresponding block activation signal BACTk is inactive, and is inactivated according to the column selection result when the corresponding block activation signal BACTk is active. Similarly, the block write activation signal WBACTk is also used as the activation signal of the plurality of write selection gates 30 and write control circuit 40 provided for the memory block MBk. Write selection gate 30 and write control circuit 40 are activated and inactivated when the corresponding block write activation signal WBACTk is active and inactive, respectively.

Control circuit 510 further includes an inverter 530 inverting the sense enable signal SE from control circuit 500, a logic gate 532 for outputting an OR logical operation result of the inverted signal of the output of inverter 530 and the read activation signal RACT, an inverter 534 for further inverting the output of inverter 530, and a logic gate 536 outputting an NAND logical operation result of the output of inverter 530, the block selection signal Zk and the read activation signal RACT. Control circuit 510 further includes an inverter 538 inverting the output of logic gate 536, a logic gate 540 outputting an NAND logical operation result of the block selection signal Zk and the output of logic gate 532, an inverter 542 inverting the output of logic gate 540, a logic gate 544 outputting an NAND logical operation result of the block selection signal Zk and the output of inverter 534, an inverter 546 inverting the output of logic gate 544, and an inverter 548 inverting the output of inverter 530.

Inverter 538 outputs the block read activation signal RBACTk. Inverter 542 generates the local precharge signal /LDPCHk. Inverter 546 outputs the block sense enable signal BSSEk. Inverter 548 generates the global precharge signal /GDPCH.

FIG. 6 shows operation waveforms related to a setting of the control signal group generated by control circuits 500, 510 in data writing (the write mode).

Referring to FIG. 6, the internal clock signal intCLK is generated in synchronization with the clock signal CLK of a prescribed frequency provided to semiconductor memory device 2 from the outside. Internal operation of semiconductor memory device 2 is performed in synchronization with the chip activation signal ACT synchronized with the internal clock signal intCLK. A mode control signal /W is set to the L level in data writing (the write mode), and is set to the H level in data reading (the read mode). The read cycle signal RE is, as the mode control signal /W, activated to the H level in the clock cycle of the read mode, and is inactivated to the L level in the other periods.

An address signal ADD including a row address and a column address is input in synchronization with a rising edge of the clock signal CLK. In FIG. 5, the row address is fixed and the column address is given consecutively.

The word line selected according to the row address (WLk1 in FIG. 5) is activated to the H level in a synchronized timing with the internal clock signal intCLK. The column selection signals selected according to the column address (Y1 and Yn in FIG. 5) are activated to the H level in clock cycles C1 and C2, respectively.

The write activation signal WACT is activated in a synchronized timing with the internal clock signal intCLK in data writing (the write mode), while maintaining the inactive state (the L level) in data reading (the read mode). In contrast, the read activation signal RACT is activated in a synchronized timing with the internal clock signal intCLK in data reading (the read mode), while maintaining the inactive state (the L level) in data writing (the write mode).

The sense enable signal SE is fixed to the inactive state (the L level) in data writing (the write mode). In response to this, the block sense enable signal BSSEk and the block read activation signal RBACTk are fixed to the inactive state (the L level), while the global precharge signal /GDPCH is fixed to the active state (the L level).

In the active period (the H level) of the sense enable signal SE, the local precharge signal /LDPCHk is inactivated to the H level when the corresponding memory block MBk is selected, and is activated to the L level in the other periods including the write mode.

In a clock cycle where the memory block MBk is selected and the block selection signal Zk is activated to the H level, the block activation signal BACTk is activated in a synchronized timing with the chip activation signal ACT. In the write mode, the corresponding block write activation signal WBACTk is also activated in a synchronized timing with the chip activation signal ACT. On the other hand, the block read activation signal RBACTk and the block sense enable signal BSSEk are inactivated to the L level in the write mode even in the selected memory block MBk, as described above.

In the inactive period (the L level) of the block activation signal BACTk, bit line precharge and equalize circuit 10 precharges each of the bit lines BIT and /BIT arranged in the memory block MBk to the bit line precharge voltage Vbp. On the other hand, in the active period (the H level) of the block activation signal BACTk, bit line precharge and equalize circuit 10 is inactivated in response to the column selection signals Y1–Yn and electrically isolates each of the corresponding bit lines BIT and /BIT from the bit line precharge voltage Vbp.

In data writing (the write mode), since each of the plurality of read selection gates 20 is inactivated in each memory block, each of the bit lines BIT and /BIT is not connected to the read data buses LRDB and /LRDB. In addition, since read data bus precharge and equalize circuit 70 and global read data bus precharge and equalize circuit 80 are activated while sense amplifier circuit 50 is inactivated, each of the read data buses LRDBk and /LRDBk and the global read data buses GRDB and /GRDB is precharged to the power supply voltage Vcc. Furthermore, the complementary global write data buses GWDB and /GWDB are set to one and the other of the H level (for example, the power supply voltage Vcc) and the L level (for example, the ground voltage Vss) respectively, corresponding to the write data.

In data writing (the write mode), activated write control circuit 40 in the selected memory block (for example, the memory block MBk) sets the voltage of the corresponding complementary write data buses (for example, the LRDBk and /LRDBk) to one and the other of the H level and the L level respectively, corresponding to the voltages of the global write data buses GWDB and /GWDB. Furthermore, each write selection gate 30 is activated, and the bit lines BIT and /BIT of the memory cell column with the corresponding column selection signals (Y1–Yn) activated are electrically coupled to the write data buses LWDBk and /LWDBk, respectively.

Consequently, the write data buses LWDBk and /LWDBk of the selected memory block are respectively set to one and the other of the H level and the L level by write control circuit 40. In addition, the voltages of the write data buses LWDBk and /LWDBk are transferred to the complementary bit lines of the selected memory cell column (for example, BITk1 and /BITk1 in the clock cycle C1) respectively by write selection gate 30. The voltages of the complementary bit lines of the selected memory cell column are further transferred to the selected memory cell with the corresponding word line (for example, WLk1) activated.

It is to be noted that, though not shown in the drawing, the mode control signal /W is activated to the H level and correspondingly, the read cycle signal RE is set to the H level in the read mode. In response to this, while the write activation signal WACT is fixed to the L level, the read activation signal RACT is activated in the synchronized timing with the chip activation signal ACT. Furthermore, the local precharge signal /LDPCH and the global precharge signal /GDPCH is inactivated to the H level, and the block write activation signal WBACTk is also inactivated to the L level. In contrast, the block read activation signal RBACTk is activated in the synchronized timing with the chip activation signal ACT. In addition, the block sense enable signal BSSEk is set to the H level when the memory block MBk is selected.

Accordingly, in data reading (the read mode), the memory cell group with corresponding word line activated is connected to the corresponding complementary bit lines BIT and /BIT, so that the voltage difference of the polarity corresponding to the stored data of the selected memory cell is generated between the bit lines BIT and /BIT. Because each read selection gate 20 is activated in the read mode, the complementary bit lines BIT and /BIT with corresponding column selection signals (Y1–Yn) activated are electrically coupled to the read data buses LRDBk and /LRDBk, respectively. Furthermore, because read data bus precharge and equalize circuit 70 and global read data bus precharge and equalize circuit 80 are inactivated while sense amplifier circuit 50 is activated, the voltage difference generated between the bit lines BIT and /BIT is amplified and transferred to the read data buses LRDBk and /LRDBk as well as the global read data buses GRDB and /GRDB. As a result, each of the read data buses LRDBk and /LRDBk, and each of the global read data buses GRDB and /GRDB are set to one and the other of the H level (for example, the power supply voltage Vcc) and the L level (for example, the ground voltage Vss) respectively, corresponding to the read data.

Thus, by providing the dedicated data bus groups for data reading and data writing respectively, the precharge of the data bus group for data reading can be performed in the data writing operation. With this, the data reading cycle can be shortened so that the operation of the entire semiconductor memory device can be fastened.

Meanwhile, a defect acceleration test (a burn-in test), to screen a chip by accelerating a potential early defect must be performed in a semiconductor memory device to ensure the operational responsibility. During the burn-in test, such potential defect is revealed generally by applying a high temperature or a high voltage (high electric field) stress to a completely manufactured wafer (chip). For semiconductor memory devices of larger capacity or larger scale, reduction of the needed test time per chip by effectively performing such burn-in test is considered to be important in the aspect of cost reduction.

In the structure of the conventional semiconductor memory device 2 shown in FIG. 5, the burn-in test must be performed while the above-mentioned write mode is set in order to apply an equal stress to each memory cell MC. In practice, the burn-in test is performed after parallel activation of two or more of column selection signals Y1–Yn and selective parallel activation of two or more of word lines WLs besides setting of the write mode.

In the conventional structure wherein the common operations in the write mode and the read mode are performed for the normal operation and the burn-in test, however, the voltage stress cannot be applied to the data bus group of the data reading system, that is, the read data bus pair LRDBP and the global read data bus pair GRDBP. Therefore, the burn-in test must be performed again after switching the operation mode from the write mode to the read mode in order to reveal the early defect of the data bus of the data reading system. This leads to a longer time per chip needed for performing the burn-in test.

SUMMARY OF THE INVENTION

An object of the present invention is to perform a burn-in test effectively in a short time in a semiconductor memory device having a structure provided with dedicated data bus groups corresponding to data reading and data writing, respectively.

In summary, the present invention is directed to a semiconductor memory device including a plurality of memory cells, a plurality of word lines, a plurality of bit line pairs, a write data bus pair, a write control circuit, a plurality of write selection gates, a read data bus pair, a plurality of read selection gates, a sense amplifier circuit, and a precharge and equalize circuit control circuit. Each of the plurality of memory cells stores data. The plurality of word lines are provided corresponding to respective memory cell rows. The plurality of bit line pairs are provided corresponding to respective memory cell columns, and each is formed with complementary first and second bit lines. The write data bus pair is formed with complementary first and second write data buses. When activated, the write control circuit sets the first and second write data buses to one and the other of the first and second voltages respectively, corresponding to write data. The plurality of write selection gates are provided corresponding to respective memory cell columns, and each connects corresponding ones of the first and second bit lines to the first and second write data buses respectively according to a column select result, when activated. The read data bus pair is formed with complementary first and second read data buses. The plurality of read selection gates are provided corresponding to respective memory cell columns, and each connects corresponding ones of the first and second bit lines to the first and second read data buses respectively according to the column select result, when activated. The sense amplifier circuit amplifies a voltage difference between the first and second read data buses, when activated. The precharge and equalize circuit sets each of the first and second read data buses to a prescribed voltage, when activated. The control circuit controls activation of the write control circuit, the plurality of write selection gates, the plurality of read selection gates, the sense amplifier circuit, and the precharge and equalize circuit. The control circuit activates the write control circuit, the plurality of write selection gates, the plurality of read selection gates, and the sense amplifier circuit and deactivates the precharge and equalize circuit, during a test different from a normal operation.

The test preferably corresponds to a burn-in test to reveal a potential defect by applying a voltage stress, and during the test, at least one or a plurality of the memory cell rows and at least one or a plurality of the memory cell columns are selected at one time.

Therefore, a primary advantage of the present invention is that, a voltage difference can be applied between complementary data buses concurrently to both of the read data bus pair for data reading and the write data bus pair for data writing during the test corresponding to the burn-in test. Thus, a voltage stress can be applied between these complementary data buses concurrently without switching the modes in this test. As a result, the burn-in test to reveal an early potential defect by applying a voltage stress can be performed effectively in a short time.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
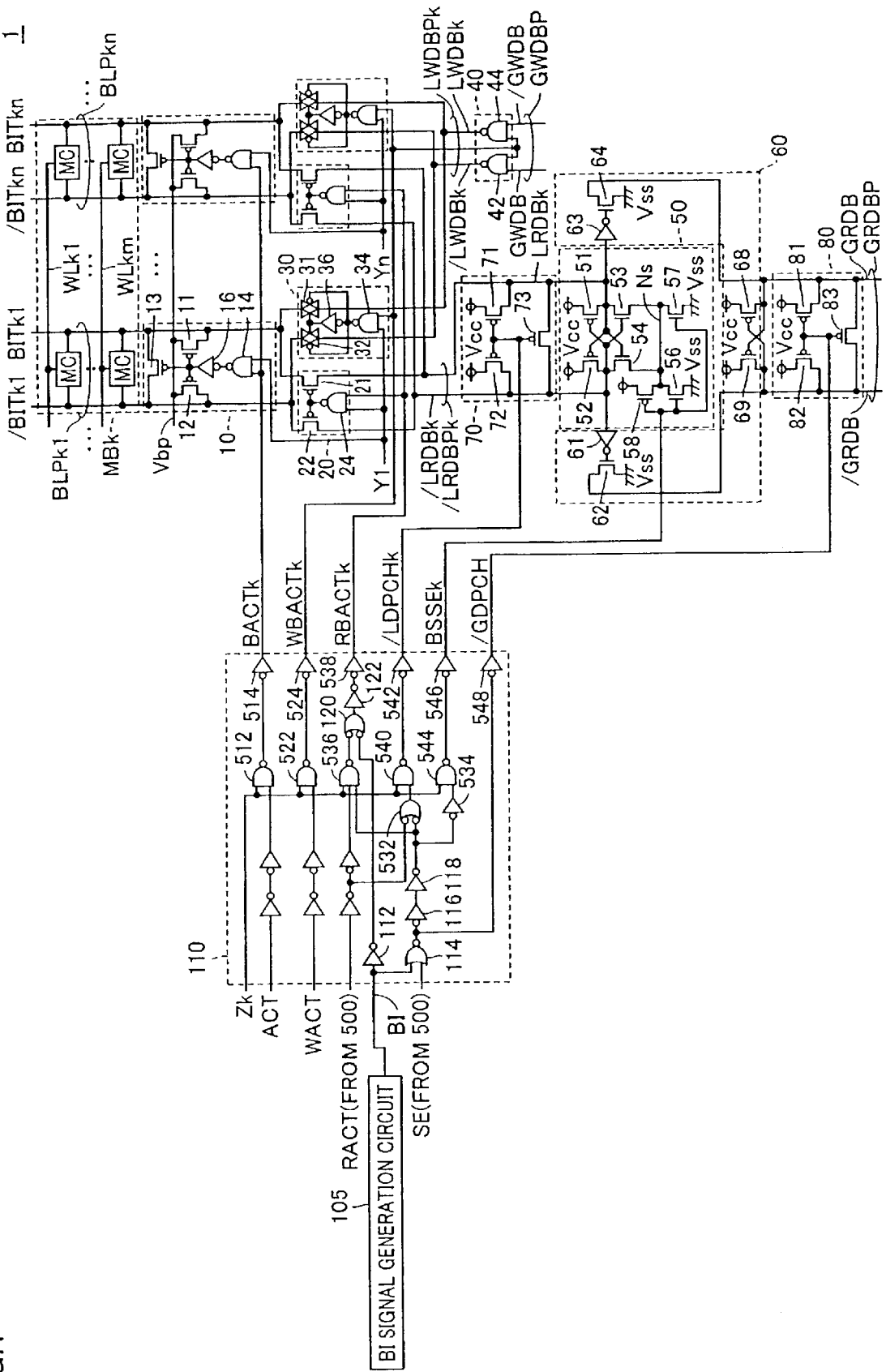
FIG. 1 is a circuit diagram showing a whole structure of a semiconductor memory device according to an embodiment of the present invention.

Embodiments of the present invention will be described in detail with reference to the drawings. The same characters in the drawings indicate the same or corresponding portions.

Referring to FIG. 1, a semiconductor memory device 1 according to the first embodiment differs from semiconductor memory device 2 shown in FIG. 5 in that, it includes a control circuit 110 in place of control circuit 510, and further includes a burn-in signal generation circuit (also referred to as "BI signal generation circuit" hereinafter). For the other portions, similar to semiconductor memory device 2, semiconductor memory device 1 includes at least one memory block MB having a plurality of memory cells MCs arranged in rows and columns; a plurality of bit line precharge and equalize circuits 10, a plurality of read selection gates 20, a plurality of write selection gates 30, a write control circuit 40, a sense amplifier circuit 50, a read data bus drive circuit 60, and a read data bus precharge and equalize circuit 70 provided for each memory block; and a global read data bus precharge and equalize circuit 80 provided to the memory block in common.

Though operations of bit line precharge and equalize circuit 10, read selection gate 20, write selection gate 30, write control circuit 40, sense amplifier circuit 50, read data bus drive circuit 60, read data bus precharge and equalize circuit 70, and global read data bus precharge and equalize circuit 80 are similar to that of semiconductor memory device 2 shown in FIG. 5, a specific exemplary structure for each circuit will also be described below.

SRAM (Static Random Access Memory) cell is typically arranged as each memory cell MC for storing data, but a structure or a type of the memory cell is not limited in the application of the present invention. A word line WL is provided independently to each memory block MB and corresponding to each memory cell row, while a bit line pair BLP formed with complementary bit lines BIT and /BIT is provided independently to each memory block MB and corresponding to each memory cell column. FIG. 1 representatively shows a structure corresponding to first and mth memory cell rows and first and nth memory cell columns of kth memory block MBk, as shown in FIG. 5.

Bit line precharge and equalize circuit 10 is provided corresponding to each memory cell column in each memory block MB. Bit line precharge and equalize circuit 10 corresponding to the first memory cell column of the memory block MBk includes, for example, P-channel MOS transistors 11 and 12 electrically coupled between corresponding bit lines BITk1 and /BITk1 and the bit line precharge voltage Vbp respectively, a P-channel MOS transistor 13 electrically coupled between corresponding bit lines BITk1 and /BITk1, a logic gate 14 outputting an NAND logical operation result of corresponding column selection signal Y1 and corresponding block activation signal BACTk, and an inverter 16 inverting the output of logic gate 14 and providing it to each gate of transistors 11–13.

This bit line precharge and equalize circuit 10 isolates each of the corresponding bit lines BITk1 and /BITk1 from the bit line precharge voltage when the corresponding memory block MBk is selected and the block activation signal BACTk is activated (to the H level) and the corresponding column selection signal Y1 is activated (to the H level), and electrically couples each of the corresponding bit lines BITk1 and /BITk1 to the bit line precharge voltage Vbp for precharging in the other periods. Bit line precharge and equalize circuit 10 having a similar structure is also arranged for each of other memory cell columns.

Read selection gate 20 is provided to each memory block MB corresponding to each memory cell column. A structure of the read selection gate provided corresponding to the first memory cell column of the memory block MBk will representatively be described.

Read selection gate 20 includes a P-channel MOS transistor 21 electrically coupled between corresponding bit line BITk1 and a read data bus LRDBk, a P-channel MOS transistor 22 electrically coupled between corresponding bit line /BITk1 and a read data bus /LRDBk, and a logic gate 24 outputting an NAND logical operation result of the block read activation signal RBACTk and corresponding column selection signal Y1. The output of logic gate 24 is provided to each gate of transistors 21 and 22.

Therefore, read selection gate 20 is activated when the corresponding memory block MBk is selected and the block read activation signal RBACTk is activated (to the H level), and electrically couples the read data buses LRDBk and /LRDBk to the bit lines BITk1 and /BITk1 respectively when the corresponding column selection signal Y1 is further activated (to the H level). When the corresponding block read activation signal RBACTk is inactivated (to the L level), that is, when inactivated, read selection gate 20 disconnects the read data buses LRDBk and /LRDBk from the bit lines BITk1 and /BITk1 regardless of the corresponding column selection signal Y1. The read selection gate having the similar structure is also arranged for each of other memory cell columns.

Write selection gate 30 is provided corresponding to each memory cell column in each memory block MB. A structure of the write selection gate provided corresponding to the first memory cell column of the memory block MBk will representatively be described.

Write selection gate 30 includes a transfer gate 31 connected between the corresponding bit line BITk1 and the write data bus LWDBk, a transfer gate 32 connected between the corresponding bit line /BITk1 and the write data bus /LWDBk, a logic gate 34 outputting an NAND logical operation result of block write activation signal WBACTk and corresponding column selection signal Y1, and an inverter 36 inverting the output of logic gate 34 and providing it to each of transfer gates 31 and 32.

Therefore, write selection gate 30 is activated when the corresponding memory block MBk is selected and the block write activation signal WBACTk is activated (to the H level), and electrically couples the write data buses LWDBk and /LWDBk to the bit lines BITk1 and /BITk1 respectively when the corresponding column selection signal Y1 is further activated (to the H level). When the corresponding block write activation signal WBACTk is inactivated (to the L level), that is, when inactivated, write selection gate 30 disconnects the write data buses LWDBk and /LWDBk from the bit lines BITk1 and /BITk1 regardless of the corresponding column selection signal Y1. The write selection gate having the similar structure is also arranged for each of other memory cell columns.

Write control circuit 40 includes a logic gate 42 which sets the voltage of the write data bus /LWDBk to the H level (the power supply voltage Vcc) or the L level (the ground voltage Vss) corresponding to an NAND logical operation result between the voltage levels of the global write data bus GWDB and the corresponding block write activation signal WBACTk, and a logic gate 44 which sets the voltage of the write data bus LWDBk to the H level (the power supply voltage Vcc) or the L level (the ground voltage Vss) corresponding to an NAND logical operation result between the voltage levels of the global write data bus /GWDB and the corresponding block write activation signal WBACTk.

Therefore, write control circuit 40 is activated in response to the activation (to the H level) of the corresponding block write activation signal WBACTk. In the memory block with activated write control circuit 40, the corresponding write data buses (for example, LWDBk and /LWDBk) are set to one and the other of the H level and the L level respectively. On the other hand, in the memory block with inactivated write control circuit 40, each of the corresponding write data buses is set to the H level.

Sense amplifier circuit 50 includes P-channel MOS transistors 51 and 52 electrically coupled between the read data buses LRDBk and /LRDBk and the power supply voltage Vcc respectively, N-channel MOS transistors 53 and 54 electrically coupled between the read data buses LRDBk and /LRDBk and a node Ns respectively, N-channel MOS transistors 56 and 57 connected in parallel between the node Ns and the ground voltage Vss, and a P-channel MOS transistor 58 electrically coupled between the power supply voltage Vcc and the node Ns. Each gate of transistors 51 and 53 is connected to the read data bus /LRDBk, and each gate of transistors 52 and 54 is connected to the read data bus LRDBk. Each gate of transistors 56, 57 and 58 receives the input of the block sense enable signal BSSEk.

Sense amplifier circuit 50 is activated in response to activation (to the H level) of the corresponding block sense enable signal BSSEk, and amplifies the voltage difference between the read data buses LRDBk and /LRDBk by amplification operations of transistors 51–54 as so-called cross-coupled amplifiers. On the other hand, when the corresponding block sense enable signal BSSEk is inactivated (to the L level), transistors 51–54 do not perform the amplification operations because the node Ns is coupled to the power supply voltage Vcc. That is, sense amplifier circuit 50 is inactivated so that the amplification operation between the read data buses LRDBk and /LRDBk is not performed.

Read data bus drive circuit 60 includes inverters 61, 63, N-channel MOS transistors 62, 64, and P-channel MOS transistors 68, 69. Inverter 61 inverts the voltage level of the read data bus /LRDBk and outputs it to the gate of transistor 62. Inverter 63 inverts the voltage level of the read data bus LRDBk and outputs it to the gate of transistor 64.

Transistor 62 is electrically coupled between the global read data bus /GRDB and the ground voltage Vss, whereas transistor 64 is electrically coupled between the global read data bus GRDB and the ground voltage Vss. Transistor 68 is electrically coupled between the power supply voltage Vcc and the global read data bus GRDB, and its gate is connected with the global read data bus /GRDB. Transistor 69 is electrically coupled between the power supply voltage Vcc and the global read data bus /GRDB, and its gate is connected with the global read data bus GRDB.

Read data bus precharge and equalize circuit 70 includes P-channel MOS transistors 71 and 72 electrically coupled between the read data buses LRDBk and /LRDBk and the power supply voltage Vcc respectively, and a P-channel MOS transistor 73 electrically coupled between the read data buses LRDBk and /LRDBk. Each gate of transistors 71–73 receives the input of the local precharge signal /LDPCHk.

Therefore, read data bus precharge and equalize circuit 70 is activated in response to activation (to the L level) of the local precharge signal /LDPCHk, and connects each of the corresponding read data buses LRDBk and /LRDBk to the power supply voltage Vcc for precharging. On the other hand, when the local precharge signal /LDPCHk is inactivated (to the H level), read data bus precharge and equalize circuit 70 is inactivated and isolates each of the read data buses LRDBk and /LRDBk from the power supply voltage Vcc.

Similarly, global read data bus precharge and equalize circuit 80 includes P-channel MOS transistors 81 and 82 electrically coupled between the global read data buses GRDB and /GRDB and the power supply voltage Vcc respectively, and a P-channel MOS transistor 83 electrically coupled between the global read data buses GRDB and /GRDB. Each gate of transistors 81–83 receives the input of the global precharge signal /GDPCH.

Therefore, global read data bus precharge and equalize circuit 80 is activated in response to activation (to the L level) of the global precharge signal /GDPCH, and connects each of the global read data buses GRDB and /GRDB to the power supply voltage Vcc for precharging. On the other hand, when the global precharge signal /GDPCH is inactivated (to the H level), global read data bus precharge and equalize circuit 80 is inactivated and isolates each of the global read data buses GRDB and /GRDB from the power supply voltage Vcc.

When global read data bus precharge and equalize circuit 80 is inactivated, read data bus drive circuit 60 amplifies the voltage difference between the global read data buses GRDB and /GRDB corresponding to the voltage difference between the complementary read data buses amplified by sense amplifier circuit 50 with corresponding read data bus precharge and equalize circuit 70 inactivated.

As shown, the block activation signal BACTk is used as a signal controlling the activation of corresponding bit line precharge and equalize circuit 10, while the block read activation signal RBACTk is used as a signal controlling the activation of corresponding read selection gate 20, and the block write activation signal WBACTk is used as a signal controlling the activation of corresponding write selection gate 30 and write control circuit 40. In addition, the activation of sense amplifier circuit 50 is controlled by the corresponding block sense enable signal BSSEk, while the activation of read data bus precharge and equalize circuit 70 is controlled by the corresponding local precharge signal /LDPCHk, and the activation of global read data bus precharge and equalize circuit 80 is controlled by the global precharge signal /GDPCH.

Bit line precharge and equalize circuit 10, read selection gate 20, write selection gate 30, write control circuit 40, sense amplifier circuit 50, read data bus drive circuit 60, and read data bus precharge and equalize circuit 70 are also similarly arranged in each of the other memory blocks.

A structure of control circuit 110 will be described below.

Figure 5:
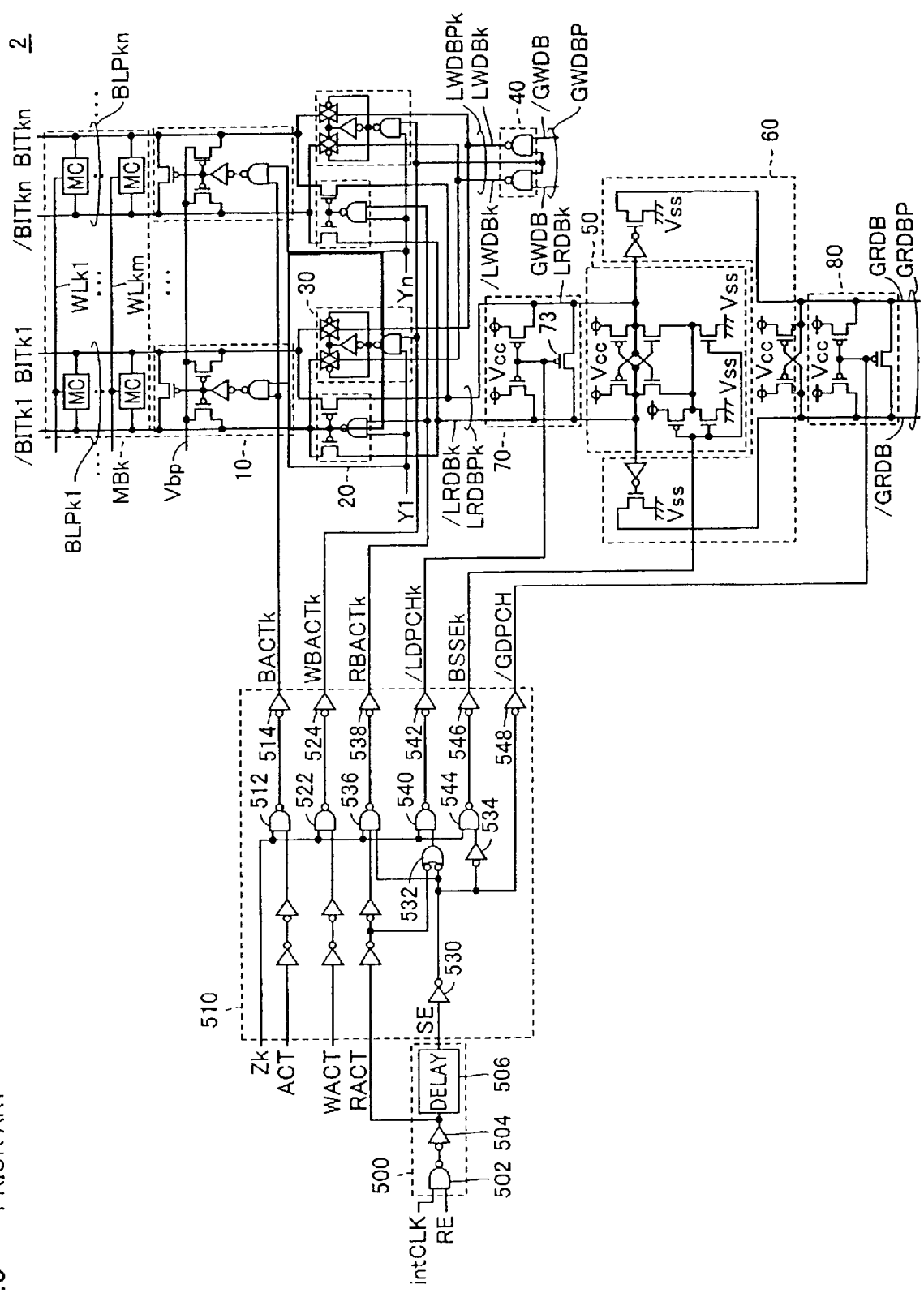
FIG. 5 is a circuit diagram showing a structure of conventional semiconductor memory device independently including a read data bus pair for data reading and a write data bus pair for data writing.

When compared with control circuit 510 shown in FIG. 5, control circuit 110 differs in having inverters 112, 116, 118 and a logic gate 114 in place of inverter 530, and in further having a logic gate 120 and an inverter 122 provided between logic gate 536 and inverter 538. In addition, BI signal generation circuit 105 generates the burn-in signal BI which is set to the H level during the burn-in test.

Inverter 112 inverts the burn-in signal BI. Logic gate 114 outputs an NOR operation result of the burn-in signal BI and the sense enable signal SE from control circuit 500 shown in FIG. 5. Inverter 116 inverts the output of logic gate 114, and inverter 118 further inverts the output of inverter 116. Logic gate 120 outputs an OR logical operation result of the inverted signal of the output from logic gate 536 and the inverted signal of the output from inverter 112. Inverter 122 inverts the output of logic gate 120 and inputs it to inverter 538. Inverter 538 inverts the output of inverter 112 and generates the block read activation signal RBACTk.

Logic gate 532 outputs an NAND logical operation result of the inverted signal of the read activation signal RACT and the output of inverter 118. Inverter 534 inverts the output of inverter 118 and transfers it to one of the inputs of logic gate 544. Inverter 548 inverts the output of logic gate 114 and generates the global precharge signal /GDPCH. As other connections of logic gates and inverters are similar to that of control circuit 510 shown in FIG. 5, detailed description thereof will not be repeated. Thus, similar to control circuit 510 shown in FIG. 5, control circuit 110 generates a control signal group to control the activation of bit line precharge and equalize circuit 10, read selection gate 20, write selection gate 30, write control circuit 40, sense amplifier circuit 50, read data bus precharge and equalize circuit 70, and global read data bus precharge and equalize circuit 80. A structure for controlling the activation of the circuit group corresponding to the memory block MBk is representatively shown in FIG. 1.

Figure 2:
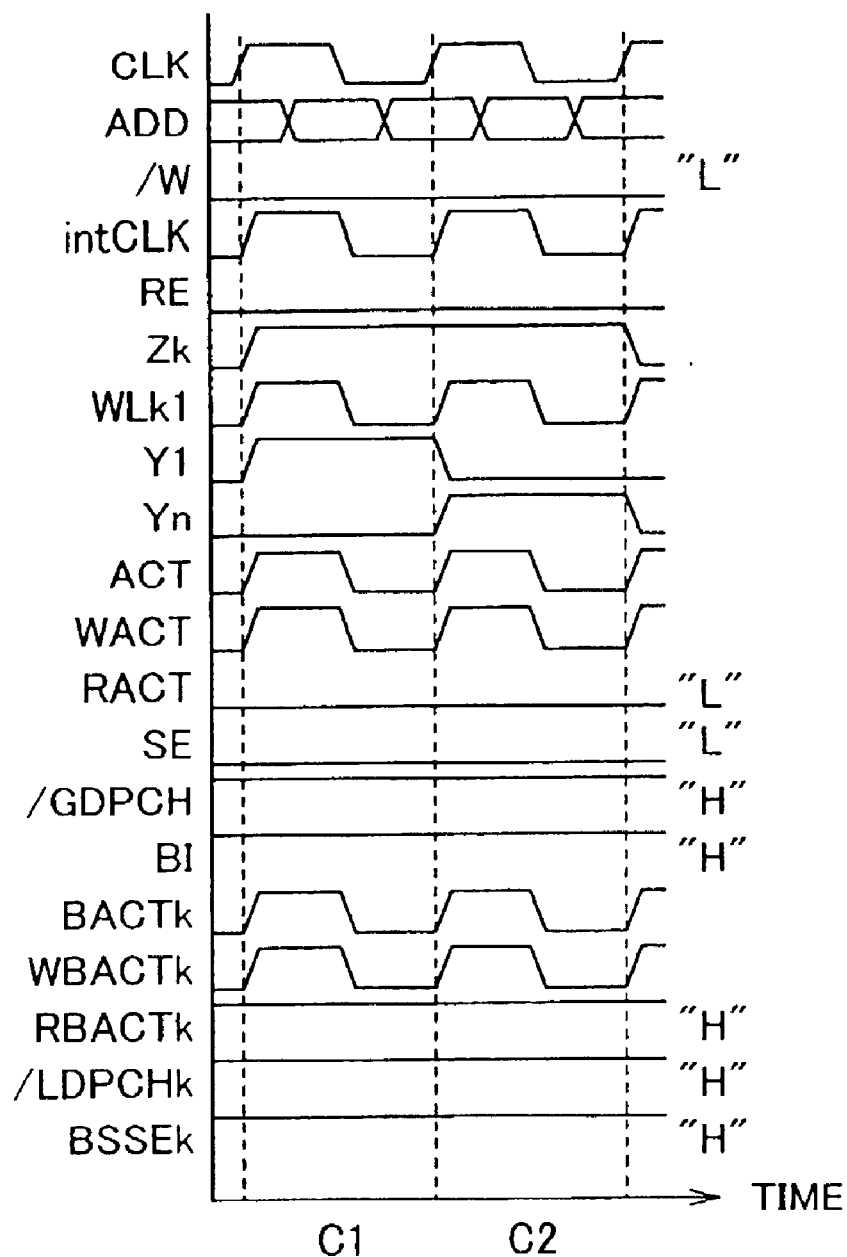
FIG. 2 is an operation waveform diagram showing a setting of a control signal group generated by the control circuit shown in FIG. 1 in a burn-in test.

Referring to FIG. 2, when the burn-in test is performed, the burn-in signal BI is set to the H level, and each of the mode control signal /W and the read cycle signal RE is fixed to the L level so as to correspond to the write mode. Responding to this, the sense enable signal SE and the read activation signal RACT are fixed to the L level as the read cycle in the normal operation. As the settings of the clock signal CLK and the internal clock signal intCLK are similar to that shown in FIG. 6, the detailed description thereof will not be repeated. On the other hand, when the burn-in test is performed, selections of the word line and the column selection signal by the address signal ADD and the memory block selection are generally performed such that, a plurality of memory cell rows, memory cell columns and memory blocks are activated simultaneously in parallel, though not shown in detail in the drawing. FIG. 2 shows the setting of the control signal group during the burn-in test when the memory block MBk is selected.

Because the burn-in signal BI is set to the H level during the burn-in test, the global precharge signal /GDPCH is forcedly inactivated (to the H level). In addition, the local precharge signal corresponding to each memory block, such as the local precharge signal /LDPCHk, is also forcedly inactivated (to the H level). Responding to this, global read data bus precharge and equalize circuit 80 and read data bus precharge and equalize circuit 70 of each memory block are inactivated. That is, each read data bus of each memory block, such as each of the global read data buses GRDB and /GRDB as well as the read data buses LRDBk and /LRDBk, is isolated from the power supply voltage Vcc corresponding to the precharge voltage.

Similarly, the block read activation signal such as the block read activation signal RBACTk is activated (to the H level) in each memory block during the burn-in test. With this, each read selection gate 20 is activated in each memory block.

The block sense enable signal such as the block sense enable signal BSSEk is similarly activated (to the H level) in each memory block during the burn-in test. With this, sense amplifier circuit 50 is activated in each memory block.

Figure 6:
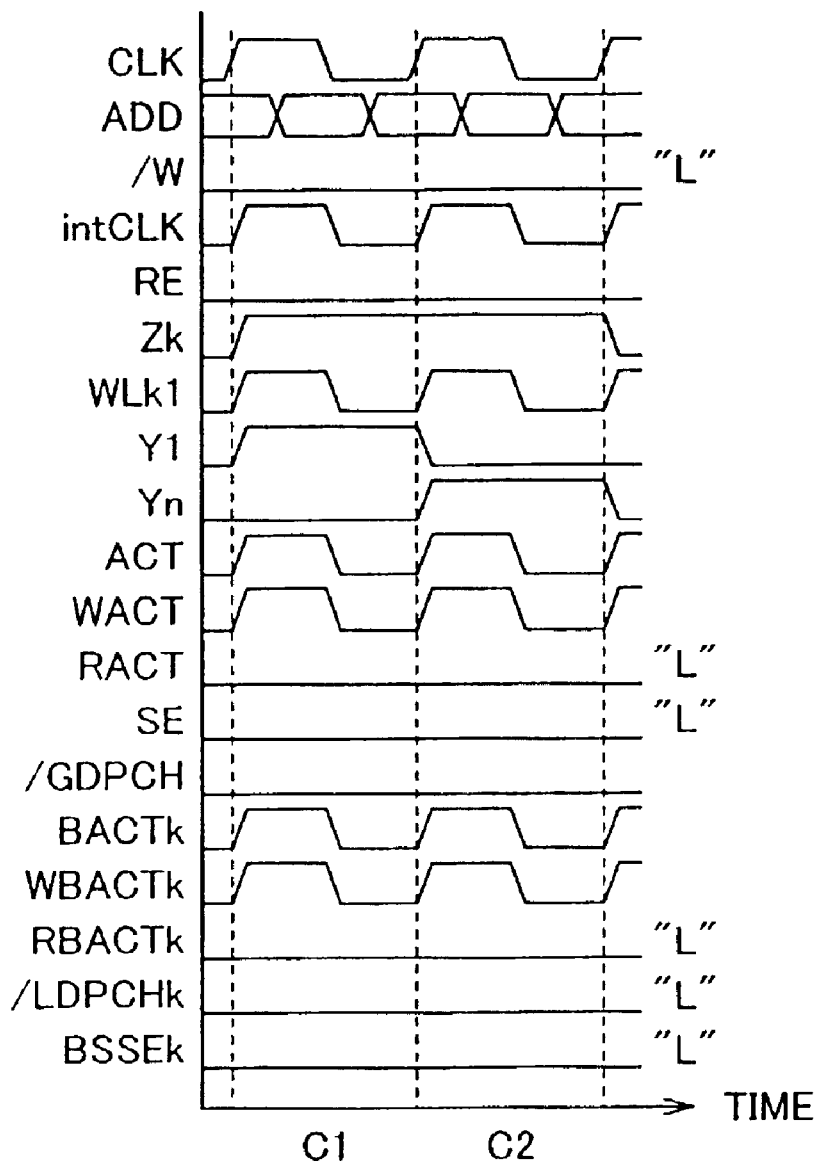
FIG. 6 is an operation waveform diagram showing a setting of a control signal group from the control circuit shown in FIG. 5 in data writing (the write mode).

On the other hand, as the block activation signal BACTk and the block write activation signal WBACTk are set similarly as shown in FIG. 6, while the bit line precharge and equalize circuit 10 is inactivated, each of write selection gate 30 and write control circuit 40 is activated as the write mode in the normal operation, that is, activated as described with reference to FIGS. 5 and 6.

With such structure, when the burn-in test is performed, activated write control circuit 40 sets the write data buses LWDBk and /LWDBk to the H level and the L level respectively, corresponding to the voltages of the global write data buses GWDB and /GWDB. Furthermore, as each write selection gate 30 is activated, the voltage difference between the write data buses LWDBk and /LWDBk is transferred to the voltage difference between the corresponding bit lines BIT and /BIT in the memory cell column with corresponding column selection signal activated.

Furthermore, as each read selection gate 20 is activated, the corresponding bit lines BIT and /BIT are electrically coupled to the read data buses LRDBk and /LRDBk respectively. As each read data bus precharge and equalize circuit 70 and global read data bus precharge and equalize circuit 80 are inactivated and each sense amplifier circuit 50 is activated during the burn-in test, the voltage difference between the bit lines BIT and /BIT is amplified and transferred as the voltage difference between the read data buses LRDBk and /LRDBk and the voltage difference between the global read data buses GRDB and /GRDB.

Because the burn-in signal BI is fixed to the L level during the normal operation, control circuit 110 operates as control circuit 510 shown in FIG. 6. Therefore, as described with reference to FIGS. 5 and 6, either the write mode (data writing operation) or the read mode (data reading operation) which is set corresponding to the mode control signal /W is performed.

With such structure, the voltage stress can be applied simultaneously to the global write data buses GWDB and /GWDB as well as the write data buses LWDBk and /LWDBk which are the data buses of the data writing system, the global read data buses GRDB and /GRDB as well as the read data buses LRDBk and /LRDBk which are the data buses of the data reading system, each of the bit lines BIT and /BIT, and the plurality of memory cells MCs by one mode setting without independently performing the operations respectively corresponding to the read mode and the write mode in the normal operation. As a result, the burn-in test for revealing the early potential defect by applying a voltage stress can be performed effectively in a short time.

Another exemplary structure for the control circuit will be described using FIG. 3.

Figure 3:
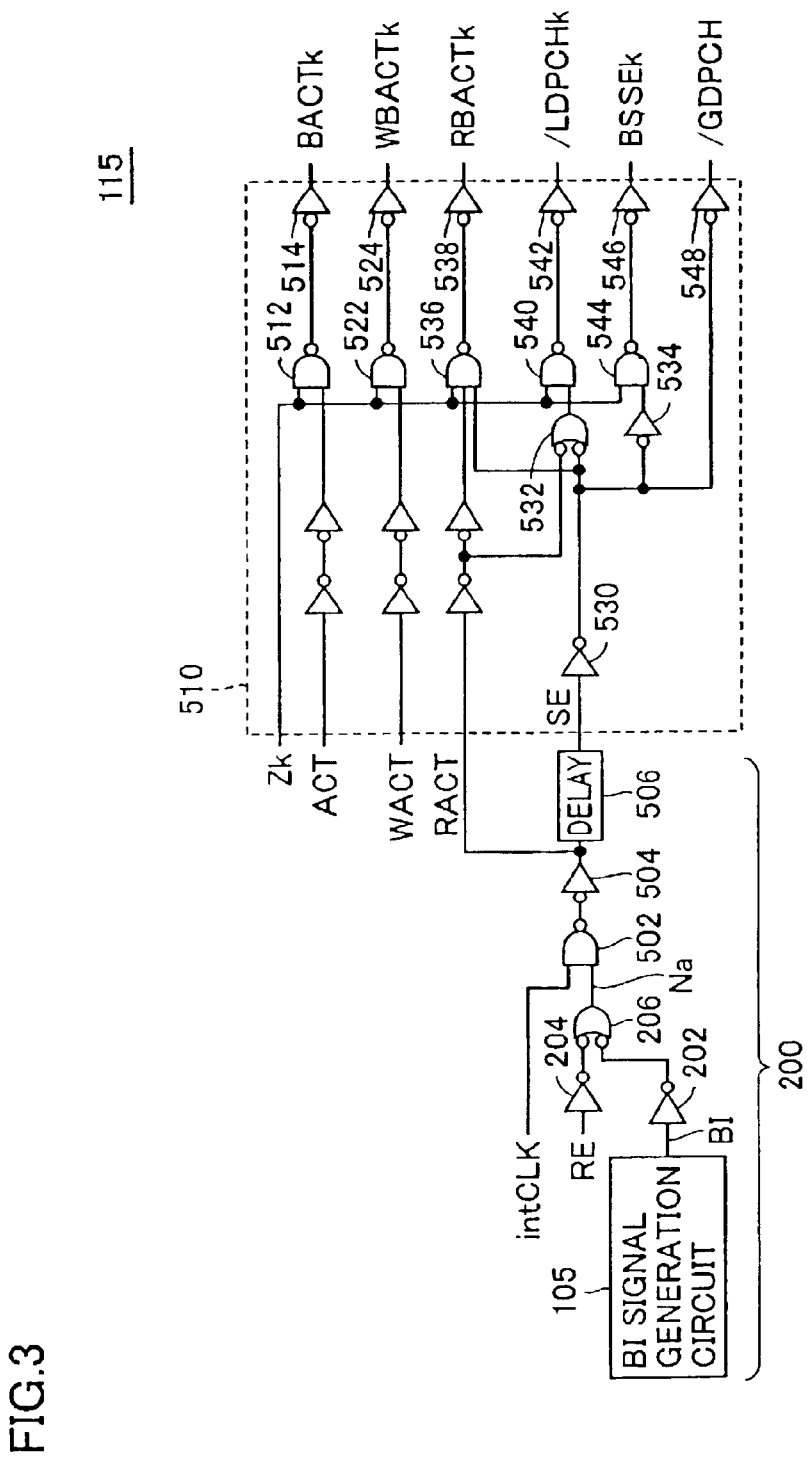
FIG. 3 is a circuit diagram showing another exemplary structure for the control circuit shown in FIG. 1.

Reffering to FIG. 3, a control circuit 115 formed with control circuits 200 and 510 is arranged in place of control circuits 110 and 500 (not shown) in semiconductor memory device 1 shown in FIG. 1. Control circuit 200 differs from control circuit 500 shown in FIG. 5 in further including a BI signal generation circuit 105, inverters 202, 204, and a logic gate 206.

Inverter 202 inverts the burn-in signal BI from BI signal generation circuit 105. Inverter 204 inverts the read cycle signal RE. Logic gate 206 outputs an NAND logical operation result of the outputs from respective inverters 202 and 204 to a node Na. The circuit group downstream from logic gate 502 operates as control circuits 500 and 510 shown in FIG. 5 corresponding to the internal clock signal intCLK and the voltage level of the node Na.

Figure 4:
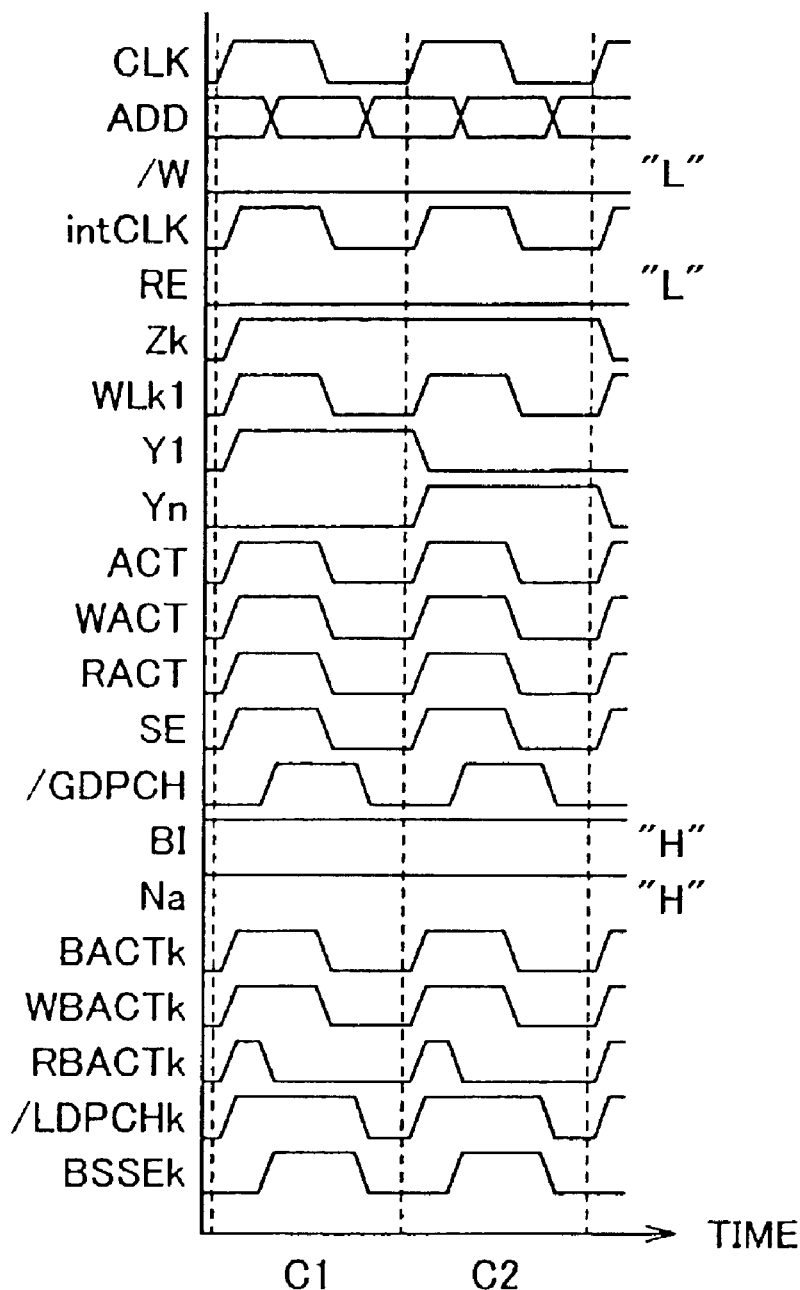
FIG. 4 is an operation waveform diagram showing a setting of a control signal group generated by the control circuit shown in FIG. 3 in a burn-in test.

FIG. 4 is an operation waveform diagram showing a setting of the control signal group generated by control circuit 115 shown in FIG. 3 during the burn-in test.

Referring to FIG. 4, during the burn-in test when the burn-in signal BI is set to the H level, the voltage of the node Na is fixed to the H level. As shown in FIG. 2, each of the mode control signal /W and the read cycle signal RE is fixed to the L level so as to correspond to the write mode. Responding to this, the sense enable signal SE and the read activation signal RACT are set as the read cycle in the normal operation. As the settings of the clock signal CLK, the internal clock signal intCLK and the address signal ADD during the burn-in test are similar to that described with reference to FIG. 2, the detailed description thereof will not be repeated.

As a result, the block activation signal BACTk and the block write activation signal WBACTk generated by control circuit 510 are generated as the write mode in the normal operation, and besides, the block read activation signal RBACTk, the local precharge signal /LDPCH, the block sense enable signal BSSEk, and the global precharge signal /GDPCH are generated as the read mode in the normal operation. Therefore, by using the control circuit with such structure, the voltage stress can also be applied simultaneously to each data bus pair of the data writing system and each data bus pair of the data reading system by one mode setting without independently performing the operations respectively corresponding to the read mode and the write mode in the normal operation. As a result, the burn-in test for revealing the early potential defect by applying a voltage stress can be performed effectively in a short time.

Furthermore, according to control circuit 115 shown in FIG. 3, the control signal group can be set independently reflecting the block selection result corresponding to the block selection signal Zk in each memory block. In contrast, according to the control circuit having the structure shown in FIG. 1, the control signal group is set similarly in each memory block.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a plurality of memory cells each storing data;
   a plurality of word lines provided corresponding to respective memory cell rows;
   a plurality of bit line pairs provided corresponding to respective memory cell columns, and each being formed with complementary first and second bit lines;
   a write data bus pair formed with complementary first and second write data buses;

a write control circuit to set said first and second write data buses to one and the other of first and second voltages respectively corresponding to write data when activated;

a plurality of write selection gates provided corresponding to respective said memory cell columns, and each connecting corresponding ones of said first and second bit lines to said first and second write data buses, respectively, according to a column select result when activated;

a read data bus pair formed with complementary first and second read data buses;

a plurality of read selection gates provided corresponding to respective said memory cell columns, and each connecting corresponding ones of said first and second bit lines to said first and second read data buses, respectively, according to a column select result when activated;

a sense amplifier circuit to amplify a voltage difference between said first and second read data buses when activated;

a precharge and equalize circuit to set each of said first and second read data buses to a prescribed voltage when activated; and a control circuit to control activation of said write control circuit, said plurality of write selection gates, said plurality of read selection gates, said sense amplifier circuit, and said precharge and equalize circuit; wherein said control circuit activates said write control circuit, said plurality of write selection gates, said plurality of read selection gates, and said sense amplifier circuit and inactivates said precharge and equalize circuit, during a test different from a normal operation.

2. The semiconductor memory device according to claim 1, wherein said a control circuit activates said write control circuit, said plurality of write selection gates, and said precharge and equalize circuit and inactivates said plurality of read selection gates and said sense amplifier circuit in a write mode of said normal operation, and activates said plurality of read selection gates and said sense amplifier circuit and inactivates said write control circuit, said plurality of write selection gates, and said precharge and equalize circuit in a read mode of said normal operation.

3. The semiconductor memory device according to claim 1, wherein said plurality of memory cells are divided into a plurality of memory blocks;

said plurality of word lines, said plurality of bit line pairs, said plurality of write selection gates, said plurality of read selection gates, said write data bus pair, said read data bus pair, said write control circuit, said sense amplifier circuit, and said precharge and equalize circuit are independently provided corresponding to each said memory block;

said semiconductor memory device further comprising:

a global write data bus pair provided to said plurality of memory blockes in common, each formed with complementary first and second global write data buses to transfer said write data;

a global read data bus pair provided to said plurality of memory blockes in common, each formed with complementary first and second global read data buses;

a global precharge and equalize circuit with an activation controlled by said control circuit to set each of said first and second global read data buses to a prescribed voltage when activated; and a read driver amplifying a voltage difference between said first and second global read data buses corresponding to a voltage difference between said first and second read data buses amplified by at least one said sense amplifier circuit when said global precharge and equalize circuit is inactive;

said write control circuit sets voltages of said first and second write data buses corresponding to voltages of said first and second global write data buses when activated; and during said test, said control circuit inactivates said global precharge and equalize circuit and, in at least one memory block selected from said plurality of memory blocks, activates said write control circuit, said plurality of write selection gates, said plurality of read selection gates, and said sense amplifier circuit and inactivates said precharge and equalize circuit.

4. The semiconductor memory device according to claim 3, wherein during said test, said control circuit inactivates said global precharge and equalize circuit and, in each said memory block, activates said write control circuit, said plurality of write selection gates, said plurality of read selection gates, and said sense amplifier circuit and inactivates said precharge and equalize circuit.

5. The semiconductor memory device according to claim 3, wherein during said test, said global precharge and equalize circuit is inactivated and, in at least one memory block selected from said plurality of memory blocks, said write control circuit, said plurality of write selection gates, said plurality of read selection gates, and said sense amplifier circuit are activated and said precharge and equalize circuit is inactivated.

6. The semiconductor memory device according to claim 3, wherein said control circuit activates said global precharge and equalize circuit and, in selected one memory block, activates said write control circuit, said plurality of write selection gates and said precharge and equalize circuit, and inactivates said plurality of read selection gates and said sense amplifier circuit in the write mode of said normal operation, while said control circuit inactivates said global precharge and equalize circuit and, in selected one memory block, activates said plurality of write selection gates and said sense amplifier circuit, and inactivates said write control circuit, said plurality of write selection gates, and said precharge and equalize circuit in the read mode of said normal operation.

7. The semiconductor memory device according to claim 1, wherein said test corresponds to a burn-in test for revealing a potential defect by applying a voltage stress; and during said test, at least one or a plurality of said memory cell rows and at least one or a plurality of said memory cell columns are selected at one time.

* * * * *